United States Patent
Goronkin et al.

(10) Patent No.: US 6,525,957 B1
(45) Date of Patent: Feb. 25, 2003

(54) MAGNETIC MEMORY CELL HAVING MAGNETIC FLUX WRAPPING AROUND A BIT LINE AND METHOD OF MANUFACTURING THEREOF

(75) Inventors: Herbert Goronkin, Tempe, AZ (US); Nicholas D. Rizzo, Gilbert, AZ (US); Bradlfy N. Engel, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/029,085

(22) Filed: Dec. 21, 2001

(51) Int. Cl.[7] .............................. G11C 11/15
(52) U.S. Cl. .............. 365/158; 365/171; 365/173; 438/3
(58) Field of Search ...................... 365/158, 173, 365/171, 51, 130; 438/3

(56) References Cited

U.S. PATENT DOCUMENTS 5,329,486 A * 7/1994 Lage ......................... 365/145
5,659,499 A    8/1997 Chen et al. ................ 365/158
6,211,090 B1 * 4/2001 Durlam et al. ............. 438/692
6,475,812 B2 * 11/2002 Nickel et al. ............... 438/3

FOREIGN PATENT DOCUMENTS

WO         WO 00/58970         10/2000

* cited by examiner

*Primary Examiner*—Andrew Q. Tran
(74) *Attorney, Agent, or Firm*—William E. Koch (57) ABSTRACT

A magneto-electronic component includes a first current line (120, 520, 620, 820) for generating a first magnetic field, a magnetic memory cell (140, 540, 640, 740, 840), and a second current line (170, 470) for generating a second magnetic field and substantially perpendicular to the first current line. The magnetic memory cell includes a multi-state memory layer having a structure adjacent to the first current line such that a magnetic flux emanating from the multi-state memory layer is substantially confined to wrap around the first current line. The second current line is located adjacent to a portion of the multi-state memory layer.

31 Claims, 3 Drawing Sheets

MAGNETIC MEMORY CELL HAVING MAGNETIC FLUX WRAPPING AROUND A BIT LINE AND METHOD OF MANUFACTURING THEREOF

FIELD OF THE INVENTION

This invention relates to electronics, in general, and to electronic components and methods of manufacture, in particular.

BACKGROUND OF THE INVENTION

The density of a magnetic memory component can be increased by reducing the lateral dimension of each magnetic memory cell in the magnetic memory component. As the lateral dimension is reduced, the volume of the magnetic memory cell decreases. Eventually, the volume of the magnetic memory cell will be decreased to the point where the energy barrier for switching the memory state of the magnetic memory cell will be comparable to the thermal energy. At this point of volume reduction, data stored within the magnetic memory cell will be lost.

One technique for alleviating this problem involves keeping the volume of the magnetic memory cell constant by increasing the thickness of the magnetic layer of the magnetic memory cell in which the data is stored. There is an upper physical limit, however, to the thickness of this magnetic layer, due to a trade-off between the magnetic exchange interaction between spins within the magnetic layer and the dipolar interaction between spins within the magnetic layer. The magnetic exchange interaction causes electron spins to align parallel to each other. The dipolar interaction causes spins in different regions of the magnetic layer to be anti-aligned. Below a critical thickness, the exchange interaction is dominant and the memory cell has all spins substantially aligned which is a single magnetic domain. If the thickness of the magnetic layer is increased above its critical thickness, then the dipolar interaction becomes dominant and the magnetic energy of the magnetic layer will be reduced by the formation of undesirable magnetic domains so that regions of the memory cell have spins aligned in substantially different directions. One specific domain structure that forms are magnetic vortices, which are circular domains with no net moment. The removal of these undesirable magnetic vortices requires a magnetic field with a high magnitude, which is incompatible with operating a magnetic memory component.

Accordingly, a need exists for a magnetic memory component with magnetic memory cells having volumes that are increased to, or at least kept above, that necessary for non-volatile data retention while increasing the density of the magnetic memory cells.

BRIEF DESCRIPTION OF THE DRAWING

The invention will be better understood from a reading of the following detailed description, taken in conjunction with the accompanying drawing figures in which.

For simplicity and clarity of illustration, the drawing figures illustrate the general manner of construction, and descriptions and details of well-known features and techniques are omitted to avoid unnecessarily obscuring the invention. Additionally, elements in the drawing figures are not necessarily drawn to scale. For example, the dimensions of some of the elements in the figures may be exaggerated relative to other elements to help to improve understanding of embodiments of the present invention. Furthermore, the same reference numerals in different figures denote the same elements.

Furthermore, the terms first, second, and the like in the description and in the claims, if any, are used for distinguishing between similar elements and not necessarily for describing a sequential or chronological order. It is further understood that the terms so used are interchangeable under appropriate circumstances and that the embodiments of the invention described herein are capable of operation in other sequences than described or illustrated herein.

Moreover, the terms top, bottom, over, under, and the like in the description and in the claims, if any, are used for descriptive purposes and not necessarily for describing relative positions. It is understood that the terms so used are interchangeable under appropriate circumstances and that the embodiments of the invention described herein are capable of operation in other orientations than described or illustrated herein.

DETAILED DESCRIPTION OF THE DRAWING

Figure 1:
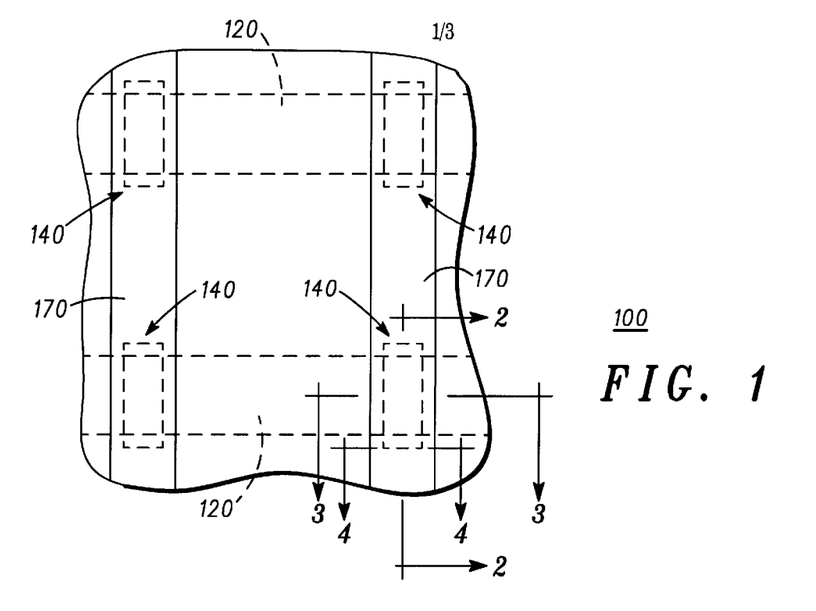
FIG. 1 illustrates a top view of a portion of a magneto-electronic component in accordance with an embodiment of the invention.
Figures 2, 3, 4:
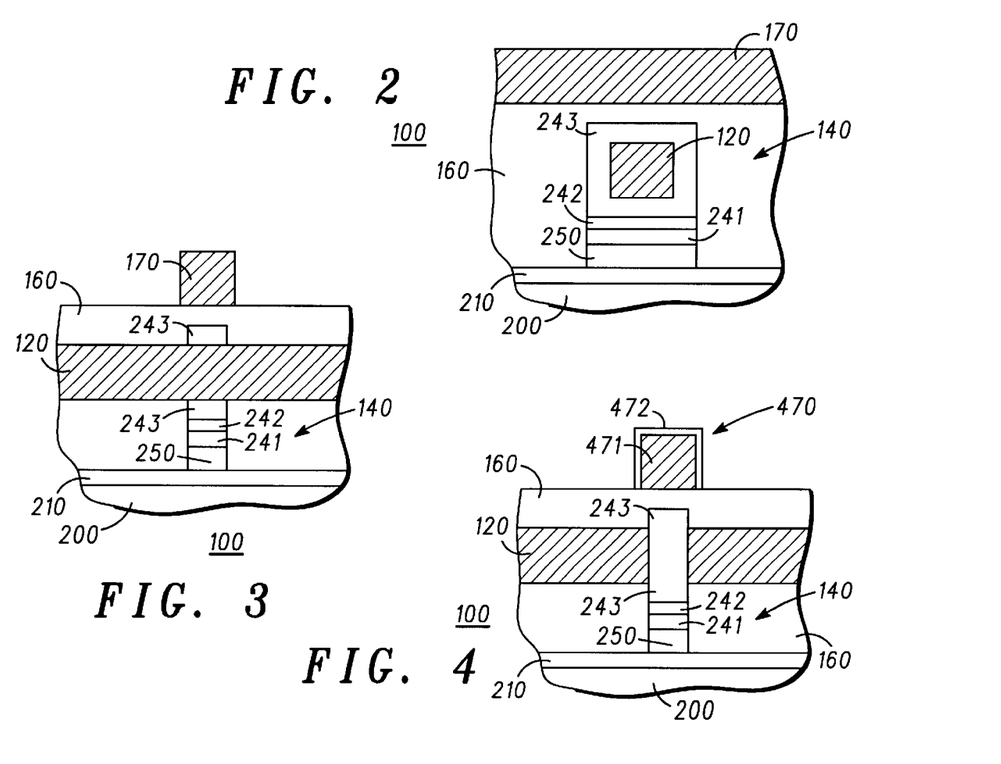
FIG. 2 illustrates a cross-sectional view of a portion of the magneto-electronic component of FIG. 1 taken along a section line 2—2 of FIG. 1 in accordance with an embodiment of the invention.
FIG. 3 illustrates a different cross-sectional view of the portion of the magneto-electronic component of FIG. 1 taken along a section line 3—3 of FIG. 1 in accordance with an embodiment of the invention.
FIG. 4 illustrates another cross-sectional view of the portion of the magneto-electronic component of FIG. 1 taken along a section line 4—4 of FIG. 1 in accordance with an embodiment of the invention.

FIG. 1 illustrates a top view of a portion of a magneto-electronic component 100. As an example, magneto-electronic component 100 can be a magnetic memory component such as an MRAM, or magneto-electronic component 100 can be some other type of magnetic transducer. FIGS. 2, 3, and 4 illustrate various cross-sectional views of a portion of magneto-electronic component 100 taken along a section lines 2—2, 3—3, and 4—4, respectively, in FIG. 1.

Magneto-electronic component 100 comprises a substrate 200 and, optionally, an electrically insulative layer 210 located over substrate 200. As an example, substrate 200 can be comprised of a semiconductor material or an electrically insulative material. As an example, electrically insulative layer 210 can be comprised of an electrically insulative material such as silicon dioxide, silicon nitride, Tetra-Ethyl-Ortho-Silicate (TEOS), or the like. Electrically insulative layer 210 can be eliminated if substrate 200 is electrically insulative.

Magneto-electronic component 100 also comprises a first plurality of bit lines 120 for generating magnetic fields. Bit lines 120 are located over electrically insulative layer 210 and substrate 200. In the preferred embodiment, each of bit lines 120 are substantially identical and parallel to each other and can be manufactured simultaneously with each other, as explained in more detailed hereinafter. Bit lines 120 are also referred to as current lines.

Bit lines 120 are comprised of an electrically conductive material. The electrically conductive material can be comprised of, for example, copper or aluminum. Each of bit lines 120 have a height and a width less than or equal to approximately one micrometer and a length significantly greater than one micrometer. As an example, each of bit lines 120 can have a height of approximately four hundred nanometers and a width of approximately four hundred nanometers.

Magneto-electronic component 100 further comprises a plurality of bits or multi-state magnetic memory cells 140 spaced across bit lines 120. In the preferred embodiment, magnetic memory cells 140 are arranged in a square or rectangular grid pattern across bit lines 120. Each of multi-state magnetic memory cells 140 are preferably substantially identical to each other and can be manufactured simultaneously with each other.

As known in the art, portions of magnetic memory cells 140 provide internal exchange bias fields for other portions of magnetic memory cells 140 to fix or set the magnetic directions of these other portions of the magnetic memory cells. The portions and the other portions of magnetic memory cells 140 are collectively referred to as "fixed layers" within magnetic memory cells 140. A layer 241 in FIGS. 2, 3, and 4 is an example of a fixed layer in one of magnetic memory cells 140. Layer 241 can be comprised of a ferromagnetic material such as, for example, nickel iron (NiFe). Additional details of layer 241 are explained hereinafter.

Magnetic memory cells 140 also comprise "free layers" having adjustable magnetic directions that can be parallel or anti-parallel to the magnetic directions of the fixed layers in magnetic memory cells 140. The free layers are multi-state memory layers that serve as the information-storing or memory-storing portions of magnetic memory cells 140.

A layer 243 in FIGS. 2, 3, and 4 is an example of a free layer in one of magnetic memory cells 140. As viewed in FIG. 2, the magnetic direction of layer 243 can be clockwise or counterclockwise around the circumference or girth of the bit line. Layer 243 can be comprised of a ferromagnetic material such as, for example, NiFe. As illustrated in FIGS. 2, 3, and 4, layer 243 can continuously circumscribe and be contiguous with the bit line. In magneto-electronic component 100, an electrically insulative layer is not required between the bit line and the magnetic memory cells. Additional details of layer 243 are explained hereinafter.

Magnetic memory cells 140 also comprise one or more dielectric layers located between the fixed layers and the free layers and are sufficiently thin to form a tunneling barrier. As an example, a layer 242 in FIGS. 2, 3, and 4 is located between layers 241 and 243. Layer 242 can be comprised of a thin dielectric material such as, for example, aluminum oxide or aluminum nitride.

Magneto-electronic component 100 still further comprises multi-state memory read-out layers or electrical contacts located adjacent to magnetic memory cells 140. A layer 250 in FIGS. 2, 3, and 4 is an example of a multi-state memory read-out layer and is electrically coupled to layer 241 to determine the direction of the magnetic state in layer 243 and read the resistance value of the overlying magnetic memory cell. Layer 250 is located adjacent to layers 241, 242, and 243 in FIGS. 2, 3, and 4 and, preferably, only a single side of bit lines 120. Layer 250 is known in the art as a Magnetic Tunnel Junction (MTJ) electrode. As an example, a tunnel junction can be located between layers 250 and 231.

Magneto-electronic component 100 additionally comprises a plurality of word or digit lines 170 for generating additional magnetic fields. Digit lines 170 are also referred to as current lines. Digit lines 170 are located over and cross over bit lines 120, and digit lines 170 are also located over, located adjacent to, and cross over magnetic memory cells 140. As illustrated in FIGS. 2, 3, and 4, layer 250 is preferably absent between digit lines 170 and bit lines 120. In the preferred embodiment, each of digit lines 170 are substantially identical and parallel to each other and can be manufactured simultaneously with each other. Also in the preferred embodiment, each of digit lines 170 are preferably substantially orthogonal to bit lines 120, and this orthogonal configuration is also known as a cross-point architecture.

Digit lines 170 can be identical in structure to bit lines 120. The digit lines, however, can also have a different embodiment from bit lines 120, as illustrated in FIG. 4 by a digit line 470. Digit line 470 comprises an electrically conductive layer 471 and a ferromagnetic cladding layer 472. In the preferred embodiment, the bit lines are devoid of any ferromagnetic cladding layers, while the digit lines preferably have the ferromagnetic cladding layers.

Ferromagnetic cladding layer 472 enables the digit line to generate a greater magnitude of magnetic field below the digit line for a given magnitude of current conducted through electrically conductive layer 471. Ferromagnetic cladding layer 472 also shields the magnetic field generated by electrically conductive layer 471 from other magnetic memory cells adjacent to the magnetic memory cell directly beneath the digit line to prevent the inadvertent switching of the memory states of these other magnetic memory cells.

Ferromagnetic cladding layer 472 is comprised of a ferromagnetic material such as, for example, a nickel iron alloy like $Ni_{80}Fe_{20}$. As an example, ferromagnetic cladding layer 472 can have a thickness of approximately twenty-five nanometers. Electrically conductive layer 471 is comprised of an electrically conductive material such as, for example, copper or aluminum.

Ferromagnetic cladding layer 472 is located adjacent to and contiguous with electrically conductive layer 471. As illustrated in FIG. 4, ferromagnetic cladding layer 472 is preferably located at three of the four sides of electrically conductive layer 471. In alternative embodiments, ferromagnetic cladding layer 472 can be located at only one side, or at two continuous or discontinuous sides.

Magneto-electronic component 100 in FIGS. 1, 2, 3, and 4 still further comprises an electrically insulative layer 160. Electrically insulative layer 160 is located between digit lines 170 and substrate 200. As an example, electrically insulative layer 160 can be comprised of silicon nitride, silicon dioxide, TEOS, or the like. Layer 160 can be comprised of a single layer or a plurality of similar or dissimilar layers.

The operation of magneto-electronic component 100 is briefly described as follows. To change a memory state of a particular one of magnetic memory cells 140, a current is conducted through a particular one of bit lines 120 that passes through the free layer of the particular one of magnetic memory cells 140, and a current is also conducted through a particular one of digit lines 170 that overlies the particular one of magnetic memory cells 140. The currents in the particular ones of bit lines 120 and digit lines 170 each produce circumferential magnetic fields as described by Maxwell's equations. The magnitudes of the magnetic fields are proportional to the magnitudes of the currents conducted through the particular ones of bit lines 120 and digit lines 170.

The magnetic fields change or rotate a magnetization direction of a free layer, or multi-state memory layer, in the particular one of magnetic memory cells 140. The magnetization direction of the free layer in FIG. 2 can be changed from clockwise to counter-clockwise and from counter-clockwise to clockwise. Reversal of the magnetization direction of the free layer can occur when an easy axis magnetic field and a hard axis magnetic field are applied to a magnetic memory cell approximately simultaneously. As illustrated in FIG. 1, the easy axis of magnetic memory cells 140 is substantially parallel to digit lines 170, and the hard axis of magnetic memory cells 140 is orthogonal to its easy axis and can be substantially parallel to bit lines 120. The easy axis magnetic field is provided by bit lines 120, and the hard axis magnetic field is provided by digit lines 170.

The resistance of a particular one of magnetic memory cells 140 is dependent upon whether the magnetization directions of the free layers and fixed layers are parallel or anti-parallel with each other. When the magnetization direction at the bottom portion of a free layer is parallel with a magnetization direction of a fixed layer within a particular one of magnetic memory cells 140, the particular one of magnetic memory cells 140 has a minimum resistance. When the magnetization direction of bottom portion of a free layer is anti-parallel with a magnetization direction of a fixed layer within a particular one of magnetic memory cells 140, the particular one of magnetic memory cells 140 has a maximum resistance. The resistance of the particular one of magnetic memory cells 140 can be detected by conducting a current through the particular one of bit lines 120 that passes through and is electrically coupled to the free layer in the particular one of magnetic memory cells 140 and then by using the multi-state memory read-out layer located underneath the particular one of magnetic memory cell 140 to read the resistance of the particular one of magnetic memory cells 140.

Returning to a description of the free layers, or multi-state memory layers, in the magnetic memory cells, or layer 243 in FIGS. 2, 3, and 4, layer 243 has a structure adjacent to the bit line such that a magnetic flux emanating from layer 243 is substantially confined to wrap around the bit line. Accordingly, the magnetic flux around the bit line is magneto-statically closed. The structure adjacent to the bit line minimizes the internal demagnetizing fields ($H_d$) in the free layer by minimizing the magnetic discontinuity at the ends of the bottom portion of layer 243. The standard memory cell has only the bottom portion of layer 243 as the magnetic free layer. By adding the additional magnetic structure around the bit line, the magnetization is substantially continuous around the bit line so that less demagnetizing charge forms at the ends of the bottom of the free layer to produce $H_d$. With $H_d$ minimized, the dipolar energy $E_d = M \times H_d$ is minimized and therefore the tendency to form a domain structure is greatly reduced compared to a free layer without the additional structure surrounding the bit line in layer 243. In the preferred embodiment, the magnetization in layer 243 is completely continuous around the bit line. However, layer 243 can also have gaps so that the amount of magnetic flux closure is less than that for a continuous structure, but more than that for a standard free layer that only consists of the bottom portion of layer 243.

Layer 243 is located adjacent to at least two sides of the bit line. In particular, as illustrated in FIGS. 2, 3, and 4, layer 243 can have a ring-like geometry to continuously circumscribe the entire girth of the bit line. This ring-like geometry eliminates ends of layer 243 such that performance variations produced by domains nucleating at the ends of the free layer can be eliminated.

Layer 243 has a length measured in a direction circumscribing the girth of the bit line. Layer 243 has a width substantially perpendicular to its length where the width is less than the length. Accordingly, the footprint of the magnetic memory cell over substrate 200 can be reduced while the volume of the magnetic memory cell can be increased to, or at least kept above, the volume necessary for non-volatile data retention. This volume increase can be accomplished without requiring the conduction of high magnitude switching currents through the digit and bit lines.

Figures 5, 6, 7, 8:
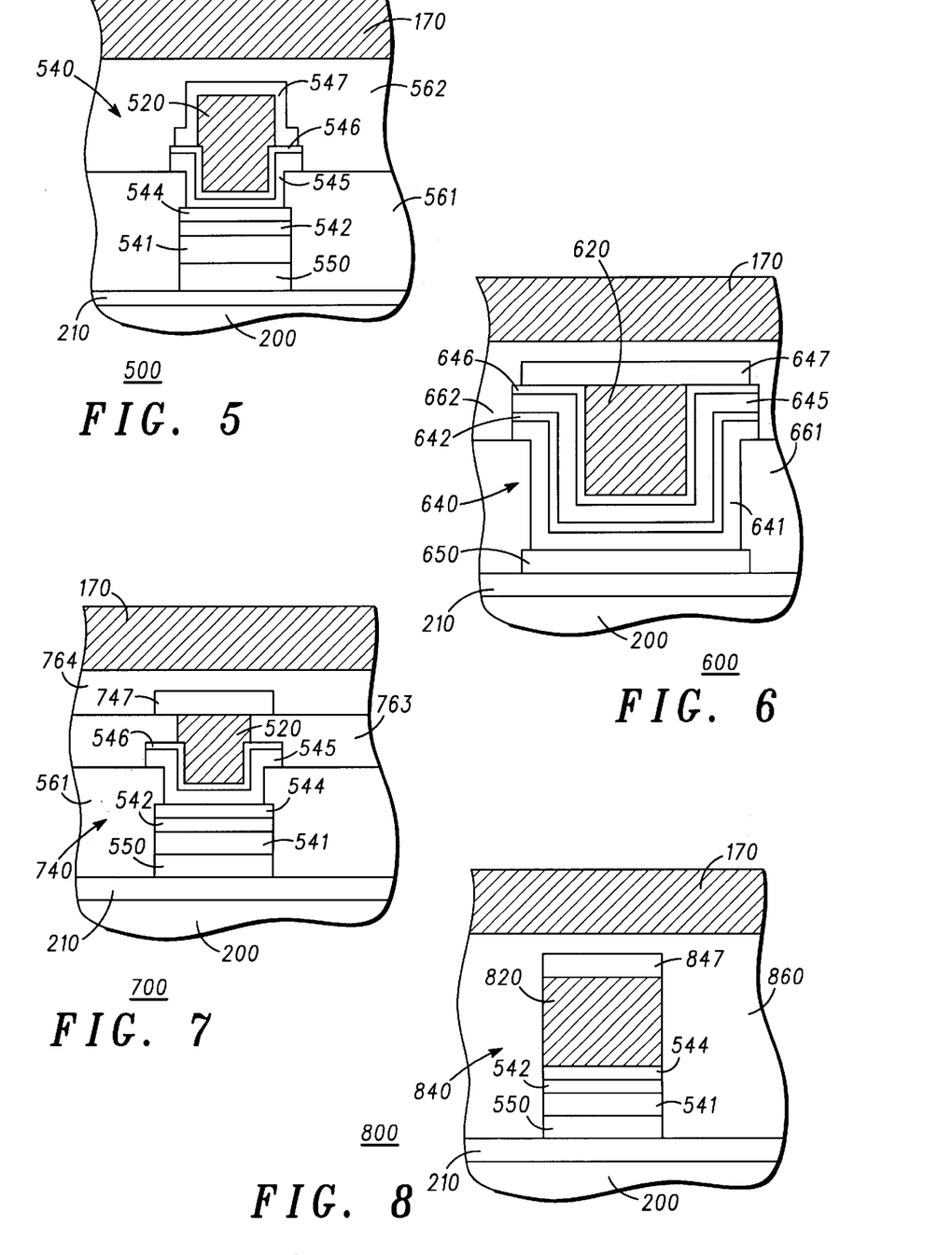
FIG. 5 illustrates a cross-sectional view of a portion of a different magneto-electronic component in accordance with an embodiment of the invention.
FIG. 6 illustrates a cross-sectional view of a portion of another magneto-electronic component in accordance with an embodiment of the invention.
FIG. 7 illustrates a cross-sectional view of a portion of an additional magneto-electronic component in accordance with an embodiment of the invention.
FIG. 8 illustrates a cross-sectional view of a portion of a further magneto-electronic component in accordance with an embodiment of the invention.

FIG. 5 illustrates a cross-sectional view of a portion of a magneto-electronic component 500, which is a different embodiment of magneto-electronic component 100 in FIGS. 1, 2, 3, and 4. The view of magneto-electronic component 500 in FIG. 5 is similar to the view of magneto-electronic component 100 in FIG. 2.

Magneto-electronic component 500 in FIG. 5 comprises a bit line 520, which can be similar to each of bit lines 120 in FIGS. 1, 2, 3, and 4. Magneto-electronic component 500 in FIG. 5 also comprises a multi-state memory read-out layer 550, which can be similar to layer 250 in FIGS. 2, 3, and 4. Magneto-electronic component 500 in FIG. 5 further comprises electrically insulative layers 561 and 562, which, collectively, can be similar to electrically insulative layer 160 in FIGS. 1, 2, 3, and 4. Magneto-electronic component 500 in FIG. 5 still further comprises a bit or multi-state magnetic memory cell 540, which can be similar to each of magnetic memory cells 140 in FIGS. 1, 2, 3, and 4. Multi-state magnetic memory cell 540 comprises a fixed layer 541, a dielectric layer 542, a free layer or multi-state memory layer comprised of layers 544, 545, and 547, and an optional etch stop layer 546.

In one embodiment, the multi-state memory layer of multi-state magnetic memory cell 540 can be continuous around the circumference or girth of bit line 520 if optional etch stop layer 546 is not used. In another embodiment, the multi-state memory layer of multi-state magnetic memory cell 540 can be discontinuous around bit line 520 if optional etch stop layer 546 is used. Either structural embodiment is acceptable if a magnetic flux emanating from the multi-state memory layer is substantially confined to wrap around bit line 520.

An example of a method of manufacturing magneto-electronic component 500 is as follows. After forming electrically insulative layer 210 over substrate 200, a single layer or a plurality of layers used to form multi-state memory read-out layer 550 can be deposited or otherwise formed over electrically insulative layer 210. Then, a single layer or a plurality of layers used to form fixed layer 541 can be deposited or otherwise formed. Next, a single layer or a plurality of layers used to form dielectric layer 542 can be deposited or otherwise formed, and subsequently, a single layer or a plurality of layers used to form layer 544 can be deposited or otherwise formed. Then, each of these layers can be etched or otherwise patterned in the reverse order that they were deposited to sequentially form a portion of the multi-state memory layer, dielectric layer 542, fixed layer 541, and multi-state memory read-out layer 550. In a different embodiment, each of multi-state memory read-out layer 550, fixed layer 541, and dielectric layer 542 can be formed before beginning to form the subsequent overlying layer, or a subset of such layers can be formed before other ones of such layers are formed.

Next, electrically insulative layer 561 is deposited or otherwise formed over electrically insulative layer 210, and a via is etched or otherwise formed into electrically insulative layer 561 to expose at least a portion of layer 544. Electrically insulative layer 561 can be comprised of a single layer or a plurality of electrically insulative layers and can be planarized. Then, a single layer or a plurality of layers used to form layer 545 can be deposited or otherwise formed, and a single layer or a plurality of layers used to form etch stop layer 546 can be deposited or otherwise formed. Now, a single layer or a plurality of layers used to form bit line 520 can be deposited or otherwise formed. Next, each of these layers can be sequentially etched or otherwise patterned in the reverse order that they were deposited to sequentially form bit line 520, etch stop layer 546, and another portion of the multi-state memory layer. Etch stop layer 546 can be electrically insulative or electrically conductive and can be used as an etch stop during the etching of the layer or layers used to form bit line 520 and to protect underlying layer 545. Other etch stops can also be used in magneto-electronic component 500 as desired. In a different embodiment, layer 545 can be formed before beginning to form the subsequent overlying layers.

Subsequently, a single layer or a plurality of layers used to form layer 547 can be deposited or otherwise formed, and then the layer or layers can be etched or otherwise patterned to form layer 547, which is yet another portion of the multi-state memory layer. Next, electrically insulative layer 562 can be deposited or otherwise formed and then planarized. Electrically insulative layer 562 can be comprised of a single layer or a plurality of layers. Digit lines 170 are formed over electrically insulative layer 562.

As illustrated in FIG. 5, the multi-state memory layer is located adjacent to at least two sides of bit line 520. In a different embodiment of magneto-electronic component 500, the multi-state memory layer of multi-state magnetic memory cell 540 can be devoid of layer 547 if a magnetic flux emanating from the multi-state memory layer is substantially confined to wrap around bit line 520. In this different embodiment, the multi-state memory layer is located adjacent to only three sides of bit line 520.

FIG. 6 illustrates a cross-sectional view of a portion of a magneto-electronic component 600, which is a different embodiment of magneto-electronic component 100 in FIGS. 1, 2, 3, and 4. The view of magneto-electronic component 600 in FIG. 6 is similar to the view of magneto-electronic component 100 in FIG. 2.

Magneto-electronic component 600 in FIG. 6 comprises a bit line 620, which can be similar to each of bit lines 120 in FIGS. 1, 2, 3, and 4. Magneto-electronic component 600 in FIG. 6 also comprises a multi-state memory read-out layer 650, which can be similar to layer 250 in FIGS. 2, 3, and 4. Magneto-electronic component 600 in FIG. 6 further comprises electrically insulative layers 661 and 662, which, collectively, can be similar to electrically insulative layer 160 in FIGS. 1, 2, 3, and 4. Magneto-electronic component 600 in FIG. 6 still further comprises a bit or multi-state magnetic memory cell 640, which can be similar to each of magnetic memory cells 140 in FIGS. 1, 2, 3, and 4. Multi-state magnetic memory cell 640 comprises a fixed layer 641, a dielectric layer 642, a free layer or multi-state memory layer comprised of layers 645 and 647, and an optional etch stop layer 646.

In one embodiment, the multi-state memory layer of multi-state magnetic memory cell 640 can be continuous around the girth or circumference of bit line 620 if optional etch stop layer 646 is not used. In another embodiment, the multi-state memory layer of multi-state magnetic memory cell 640 can be discontinuous around bit line 620 if optional etch stop layer 646 is used. Either structural embodiment is acceptable if a continuous magnetic flux emanating from the multi-state memory layer is substantially confined to wrap around bit line 620.

As illustrated in FIG. 6, the multi-state memory layer is located adjacent to at least two sides of bit line 620 where the at least two sides are adjacent to each other and where one of the at least two sides faces towards the digit lines. In a different embodiment of magneto-electronic component 600, the multi-state memory layer of multi-state magnetic memory cell 640 can be devoid of layer 647 if a magnetic flux emanating from the multi-state memory layer is substantially confined to wrap around bit line 620. In this different embodiment, the multi-state memory layer is located adjacent to only three sides of bit line 620.

FIG. 7 illustrates a cross-sectional view of a portion a magneto-electronic component 700, which is a different embodiment of magneto-electronic component 500 in FIG. 5. The view of magneto-electronic component 700 in FIG. 7 is similar to the view of magneto-electronic component 500 in FIG. 5. Magneto-electronic component 700 in FIG. 7 comprises electrically insulative layers 763 and 764, which, collectively, can be similar to electrically insulative layer 562 in FIG. 5.

Magneto-electronic component 700 in FIG. 7 also comprises a bit or multi-state magnetic memory cell 740, which can be similar to multi-state magnetic memory cells 540 in FIG. 5. Multi-state magnetic memory cell 740 comprises a free layer or multi-state memory layer comprised of layers 544, 545, and 747, and optical etch stop layer 546. The multi-state memory layer of multi-state magnetic memory cell 740 is discontinuous around bit line 520, but a magnetic flux still emanates from the multi-state memory layer and is substantially confined to wrap around bit line 520.

As illustrated in FIG. 7, the multi-state memory layer is located adjacent to at least two sides of bit line 720 where the at least two sides are adjacent to each other and where one of the at least two sides faces towards the digit lines. In a different embodiment of magneto-electronic component 700, the multi-state memory layer of multi-state magnetic memory cell 740 can be devoid of layer 747 if a magnetic flux emanating from the multi-state memory layer is substantially confined to wrap around bit line 720. In this different embodiment, the multi-state memory layer is located adjacent to only three sides of bit line 720.

FIG. 8 illustrates a cross-sectional view of a portion of a magneto-electronic component 800, which is a different embodiment of magneto-electronic component 500 in FIG. 5. The view of magneto-electronic component 800 in FIG. 8 is similar to the view of magneto-electronic component 500 in FIG. 5. Magneto-electronic component 800 in FIG. 8 comprises bit line 820, which can be similar to bit line 520 in FIG. 5. Magneto-electronic component 800 in FIG. 8 also comprises an electrically insulative layer 860, which can be similar to electrically insulative layers 561 and 562, collectively, in FIG. 5.

Magneto-electronic component 800 in FIG. 8 further comprises a bit or multi-state magnetic memory cell 840, which can be similar to multi-state magnetic memory cell 540 in FIG. 5. Multi-state magnetic memory cell 840 comprises a free layer or multi-state memory layer comprised of layers 544 and 847. The multi-state memory layer of multi-state magnetic memory cell 840 is discontinuous around bit line 820, but a magnetic flux emanating from the multi-state memory layer is still substantially confined to wrap around bit line 820. As illustrated in FIG. 8, the multi-state memory layer is located adjacent to only two opposite sides of bit line 820 where one of the two sides faces towards the digit lines, but a magnetic flux emanating from the multi-state memory layer is substantially confined to wrap around bit line 820. Etch stop layers can also be used in magneto-electronic component 800, as desired.

Figure 9:
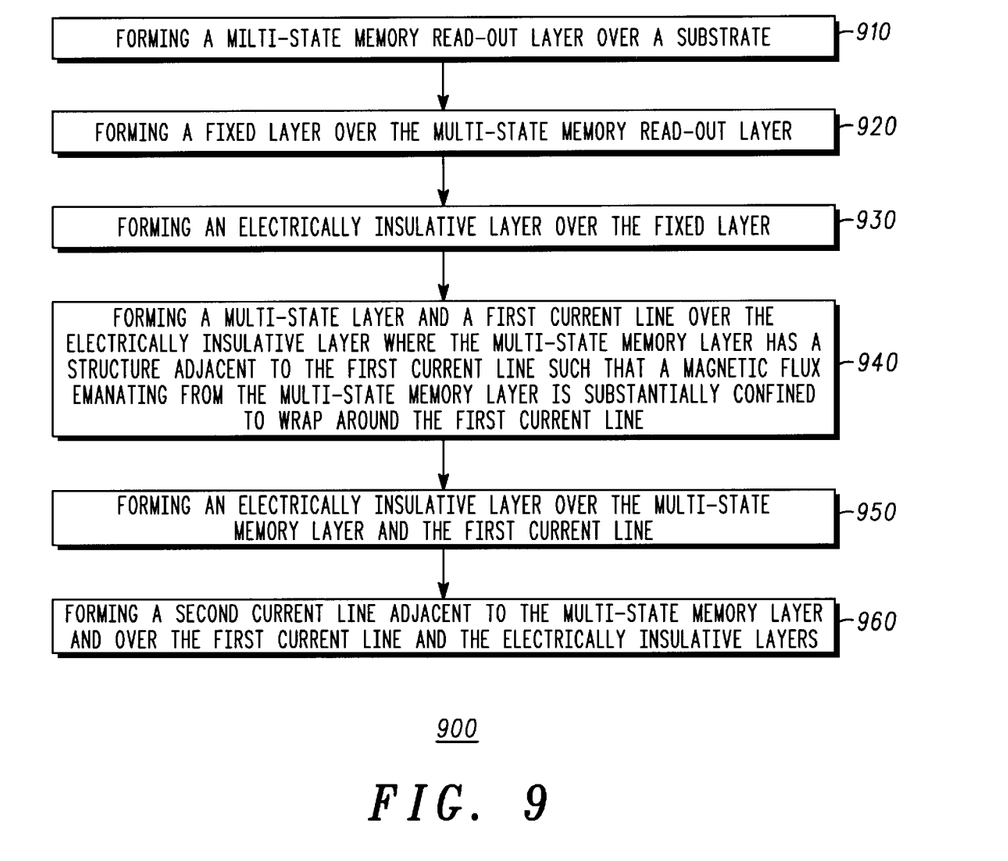
FIG. 9 outlines a method of manufacturing a magneto-electronic component in accordance with an embodiment of the invention.

FIG. 9 illustrates a flow chart 900 of a method of manufacturing a magneto-electronic component. As an example, the method in flow chart 900 can be used to manufacture any of magneto-electronic components 100, 500, 600, 700, and 800 in FIGS. 2, 5, 6, 7, and 8, respectively. At a step 910 of flow chart 900 in FIG. 9, a multi-state memory read-out layer is formed over a substrate. Next, at a step 920, a fixed layer is formed over the multi-state memory read-out layer, and at a step 930, a dielectric layer is formed over the fixed layer. The fixed layer and the dielectric layer are portions of a magnetic memory cell in the magneto-electronic component.

Then, at a step 940 of flow chart 900 in FIG. 9, a multi-state memory layer and a first current line are formed over the dielectric layer of step 930 where the multi-state memory layer has a structure adjacent to the first current line such that a magnetic flux emanating from the multi-state memory layer is substantially confined to wrap around the first current line. The multi-state memory layer is a portion of the magnetic memory cell in the magneto-electronic component, and the first current line is for generating a first magnetic field for the multi-state memory layer. One or more portions of the multi-state memory layer are formed before forming the first current line, and one or more portions of the multi-state memory layer can be optionally formed after forming the first current line. The multi-state memory layer can be continuous or discontinuous. The first current line is for generating a first magnetic field for the multi-state memory layer.

Next, at a step 950 of flow chart 900 in FIG. 9, an electrically insulative layer is formed over the multi-state memory layer and the first current line of step 940. Then, at a step 960 of flow chart 900 in FIG. 9, a second current line is formed adjacent to the multi-state memory layer and over the first current line of step 940 and the electrically insulative layer of step 950. The second current line is for generating a second magnetic field for the multi-state memory layer and crosses over the first current line. The multi-state memory read-out layer is absent between the first and second current lines.

Therefore, an improved magneto-electronic component is provided to overcome the disadvantages of the prior art. The magnetic memory cells within the magneto-electronic component have switching volumes that are increased to, or at least kept above, that necessary for non-volatile data retention. Accordingly, the super-paramagnetic limit is extended to smaller structures to provide a scaleable memory component. This volume increase can be accomplished without requiring the use of switching currents having high magnitudes. Accordingly, the footprints of each of the magnetic memory cells can be significantly reduced without degrading the data retention of the magnetic memory cells. Thus, the density of the memory array can be increased.

Additionally, the magnetic memory cells also eliminate or at least reduce the magnetic field interference from adjacent memory cells. Accordingly, the density of the memory array can be increased even further.

Moreover, the free layers or multi-state memory layers of the magnetic memory cells in the magneto-electronic component preferably have no ends to eliminate variations resulting from end-domain nucleations and to eliminate shape sensitivity during switching of memory states.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims.

For instance, the numerous details set forth herein such as, for example, the material compositions, the specific geometries, arrangements, or configurations, and the sequence of manufacturing steps are provided to facilitate the understanding of the invention and are not provided to limit the scope of the invention. As another example, the concepts disclosed herein can be applied to different types of magnetic memory cells such as, for example, magnetic memory cells having at least one electrically conductive layer separating the fixed and free layers. As a further example, the role of the digit and bit lines can be reversed. As yet another example, layer 544 in FIGS. 5 and 7 can be replaced with an etch stop layer that is not part of the multi-state memory layer. Additionally, various etch stop layers and diffusion barriers can be added.

Furthermore, digit lines 170 in FIGS. 1, 2, 3, 4, 5, 6, 7, and 8 can be located underneath the magnetic memory cells, and/or multi-state memory read-out layers 250, 550, and 650 in FIGS. 2, 3, 4, 5, 6, 7, and 8 can be located over the magnetic memory cells. In addition to or separate from moving the location of the digit lines and/or the multi-state memory read-out layers, fixed layers 241, 541, and 641 and dielectric layers 242, 542, and 642 can be located over the multi-state memory layer.

Benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims. As used herein, the term "comprises," "comprising," "includes," "including," "have," "having," or any other variation thereof, are intended to cover a non-exclusive inclusion, such that a process, method, article, or apparatus that comprises a list of elements does not include only those elements, but may include other elements not expressly listed or inherent to such process, method, article, or apparatus.

What is claimed is:

1. A magneto-electronic component comprising:
a first current line for generating a first magnetic field;

a magnetic memory cell comprising:
  a multi-state memory layer having a structure adjacent to the first current line such that a magnetic flux emanating from the multi-state memory layer is substantially confined to wrap around the first current line; and
  a second current line for generating a second magnetic field and located adjacent to a portion of the multi-state memory layer.

2. The magneto-electronic component of claim 1 further comprising:
  a multi-state memory read-out layer located adjacent and electrically coupled to the multi-state memory layer and absent between the first and second current lines such that a direction of magnetic state in the multi-state memory layer can be determined.

3. The magneto-electronic component of claim 2 wherein:
  the multi-state memory read-out layer is located adjacent to a single side of the first current line.

4. The magneto-electronic component of claim 1 wherein:
  the second current line comprises a ferromagnetic cladding layer.

5. The magneto-electronic component of claim 1 wherein:
  the first current line is substantially devoid of a ferromagnetic cladding layer.

6. The magneto-electronic component of claim 1 wherein:
  the multi-state memory layer continuously circumscribes the first current line.

7. The magneto-electronic component of claim 1 wherein:
  the multi-state memory layer is discontinuous around the first current line.

8. The magneto-electronic component of claim 1 wherein:
  the multi-state memory layer is located adjacent to two sides of the first current line.

9. The magneto-electronic component of claim 8 wherein:
  the two sides of the first current line are opposite to each other.

10. The magneto-electronic component of claim 8 wherein:
  one of the two sides of the first current line faces towards the second current line.

11. The magneto-electronic component of claim 8 wherein:
  the multi-state memory layer is located adjacent to three sides of the first current line.

12. The magneto-electronic component of claim 11 wherein:
  one of the three sides of the first current line faces towards the second current line.

13. The magneto-electronic component of claim 1 wherein:
  the multi-state memory layer has a length measured in a direction around the first current line;
  the multi-state memory layer has a width substantially perpendicular to the length of the multi-state memory layer; and
  the width of the multi-state memory layer is less than the length of the multi-state memory layer.

14. A magnetic memory component comprising:
  first current lines for generating first magnetic fields and substantially parallel to each other;
  magnetic memory cells spaced across the first current lines in a grid pattern and comprising:
    multi-state memory layers having structures adjacent to the first current lines such that magnetic fluxes emanating from the multi-state memory layers are substantially confined to wrap around the first current lines;
  second current lines for generating second magnetic fields, substantially parallel to each other, substantially orthogonal to the first current lines, and located over and adjacent to the first current lines and the multi-state memory layers; and
  multi-state memory read-out layers located underneath the first current lines, the second current lines, and the magnetic memory cells and absent between the first and second current lines.

15. The magnetic memory component of claim 14 wherein:
  each of the second current lines comprise a ferromagnetic cladding layer.

16. The magnetic memory component of claim 15 wherein:
  each of the first current lines is substantially devoid of a ferromagnetic cladding layer.

17. The magnetic memory component of claim 14 wherein:
  the multi-state memory layers continuously circumscribe the first current lines.

18. The magnetic memory component of claim 14 wherein:
  the multi-state memory layers are discontinuous around the first current lines.

19. The magnetic memory component of claim 14 wherein:
  the multi-state memory layers are located adjacent to two sides of the first current lines.

20. The magnetic memory component of claim 19 wherein:
  the two sides of the first current lines are opposite to each other.

21. The magnetic memory component of claim 19 wherein:
  one of the two sides of the first current lines faces towards the second current lines.

22. The magnetic memory component of claim 19 wherein:
  the multi-state memory layers are located adjacent to three sides of the first current lines.

23. The magnetic memory component of claim 22 wherein:
  one of the three sides of the first current lines face s towards the second current lines.

24. The magnetic memory component of claim 14 wherein:
  the multi-state memory layers have lengths measured in directions circumscribing the first current lines;
  the multi-state memory layers have widths substantially perpendicular to their lengths; and
  the widths of the multi-state memory layers are less than the lengths of the multi-state memory layers.

25. A method of manufacturing a magnetic memory component comprising:
  forming a multi-state memory layer having a structure adjacent to a first current line such that a magnetic flux from the multi-state memory layer is substantially confined to wrap around the first current line; and
  forming a second current line adjacent to the multi-state memory layer, wherein:
  the multi-state memory layer is a portion of a magnetic memory cell;
  the first current line is for generating a first magnetic field for the multi-state memory layer; and
  the second current line is for generating a second magnetic field for the multi-state memory layer.

26. The method of claim 25 further comprising:
forming a multi-state memory read-out layer,
wherein:
  the multi-state memory read-out layer is located underneath the first current line and the magnetic memory cell;
  the second current line is located over and crosses over the first current line; and
  the multi-state memory read-out layer is absent between the first and second current lines.

27. The method of claim 25 further comprising:
forming the first current line,
wherein:
  forming the multi-state memory layer further comprises:
    forming a first portion of the multi-state memory layer before forming the first current line; and
    after forming the first current line, forming an other portion of the multi-state memory layer over and adjacent to the first current line and over the first portion of the multi-state memory layer.

28. The method of claim 27 wherein:
forming the multi-state memory layer further comprises:
  forming a different portion of the multi-state memory layer before forming the first current line.

29. The method of claim 27 wherein:
the multi-state memory layer is continuous.

30. The method of claim 27 wherein:
the multi-state memory layer is discontinuous.

31. The method of claim 25 further comprising:
forming the first current line,
wherein:
  forming the multi-state memory layer further comprises:
    forming a first portion of the multi-state memory layer before forming the first current line; and
    forming an other portion of the multi-state memory layer before forming the first current line.

* * * * *

UNITED STATES PATENT AND TRADEMARK OFFICE
CERTIFICATE OF CORRECTION

PATENT NO. : 6,525,957 B1
DATED : February 25, 2003
INVENTOR(S) : Herbert Goronkin et al.

It is certified that error appears in the above-identified patent and that said Letters Patent is hereby corrected as shown below:

<u>Title page,</u>
Item [75], Inventors, "Bradlfy N. Engel" should be -- Bradley N. Engel --

Signed and Sealed this

Twenty-ninth Day of April, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,525,957 B1
DATED : February 25, 2003
INVENTOR(S) : Herbert Goronkin et al.

It is certified that error appears in the above-identified patent and that said Letters Patent is hereby corrected as shown below:

<u>Column 1,</u>
Line 7, after the Title and allowing 2 line margin, please add as a new first paragraph the following paragraph:
-- This invention was made with Government support under Agreement No. MDA972-96-3-0016 awarded by DARPA. The Government has certain rights in the invention. --

Signed and Sealed this

Ninth Day of September, 2003

JAMES E. ROGAN
*Director of the United States Patent and Trademark Office*